United States Patent
Singhal

(10) Patent No.: US 8,510,616 B2
(45) Date of Patent: Aug. 13, 2013

(54) SCALABLE SCAN-BASED TEST ARCHITECTURE WITH REDUCED TEST TIME AND TEST POWER

(75) Inventor: Rakshit Kumar Singhal, Bangalore (IN)

(73) Assignee: NVIDIA Corporation, Santa Clara, CA (US)

( * ) Notice: Subject to any disclaimer, the term of this patent is extended or adjusted under 35 U.S.C. 154(b) by 79 days.

(21) Appl. No.: 12/031,699

(22) Filed: Feb. 14, 2008

(65) Prior Publication Data

US 2009/0210759 A1 Aug. 20, 2009

(51) Int. Cl.
*G01R 31/28* (2006.01)

(52) U.S. Cl.
USPC .......................................... 714/729; 714/731

(58) Field of Classification Search
USPC .................. 714/729, 726, 727, 731, 733, 734
See application file for complete search history.

(56) References Cited

U.S. PATENT DOCUMENTS

| | | | |
|---|---|---|---|
| 2,795,755 A | 6/1957 | Anthes et al. | |
| 3,870,953 A | 3/1975 | Boatman et al. | |
| 4,700,293 A | 10/1987 | Grone | |
| 5,247,689 A | 9/1993 | Ewert | |
| 5,257,223 A * | 10/1993 | Dervisoglu | 365/154 |
| 5,258,648 A | 11/1993 | Lin | |
| 5,262,719 A | 11/1993 | Magdo | |
| 5,409,568 A | 4/1995 | Vasche | |
| 5,428,622 A * | 6/1995 | Kuban et al. | 714/729 |
| 5,499,248 A | 3/1996 | Behrens et al. | |
| 5,579,510 A | 11/1996 | Wang et al. | |
| 5,635,718 A | 6/1997 | DePuydt et al. | |
| 5,807,763 A | 9/1998 | Motika et al. | |
| 5,818,252 A | 10/1998 | Fullman et al. | |
| 5,834,844 A | 11/1998 | Akagawa et al. | |
| 5,880,592 A | 3/1999 | Sharpes et al. | |
| 5,907,562 A | 5/1999 | Wrape et al. | |
| 5,913,034 A | 6/1999 | Malcolm | |
| 5,930,269 A | 7/1999 | Tsukamoto et al. | |
| 5,946,372 A | 8/1999 | Jones et al. | |
| 5,966,021 A | 10/1999 | Eliashberg et al. | |
| 5,996,099 A | 11/1999 | Fournel et al. | |

(Continued)

FOREIGN PATENT DOCUMENTS

DE 19515591 10/1995

OTHER PUBLICATIONS

Rosinger et al., "Scan Architecture With Mutually Exclusive Scan Segment Activation for Shift- and Capture-Power Reduction," IEEE Trans. on Computer-Aided Design of Inteerated Circuits and Systems, vol. 23, No. 7, 019. 1142-1153 (Jul. 2004).*

(Continued)

*Primary Examiner* — Cynthia Britt

(57) ABSTRACT

A scalable scan-based architecture with reduced test time, test power and test pin-count in scan based testing of ICs. In an embodiment, a test vector is scanned serially into a functional memory element at a first frequency, which then de-multiplexes the bits in the test vector to multiple sub-chains at a lower frequency. Due to the use of lower frequency to scan-in, the power dissipation is reduced. Due to the use of the higher frequency to scan-in the test vector as well as multiple sub-chains, the test time is reduced. Due to the use of the functional memory elements for scanning in the test vector at higher frequency, any number of chains can potentially be supported.

18 Claims, 8 Drawing Sheets

(56) References Cited

U.S. PATENT DOCUMENTS

| | | | |
|---|---|---|---|
| 6,011,748 A | 1/2000 | Lepejian et al. | |
| 6,049,900 A | 4/2000 | Fournel et al. | |
| 6,055,619 A | 4/2000 | North et al. | |
| 6,056,784 A | 5/2000 | Stanion | |
| 6,057,698 A | 5/2000 | Heo et al. | |
| 6,081,429 A | 6/2000 | Barrett | |
| 6,085,346 A | 7/2000 | Lepejian et al. | |
| 6,097,087 A | 8/2000 | Farnworth et al. | |
| 6,114,892 A | 9/2000 | Jin | |
| 6,133,744 A | 10/2000 | Yojima et al. | |
| 6,246,252 B1 | 6/2001 | Malladi et al. | |
| 6,247,165 B1 | 6/2001 | Wohl et al. | |
| 6,297,654 B1 | 10/2001 | Barabi | |
| 6,307,162 B1 | 10/2001 | Masters et al. | |
| 6,336,212 B1 | 1/2002 | Gray et al. | |
| 6,380,555 B1 | 4/2002 | Hembree et al. | |
| 6,392,432 B1 | 5/2002 | Jaimsomporn et al. | |
| 6,420,888 B1 | 7/2002 | Griffin et al. | |
| 6,429,532 B1 | 8/2002 | Han et al. | |
| 6,472,895 B2 | 10/2002 | Jaimsomporn et al. | |
| 6,472,900 B1 | 10/2002 | Malladi et al. | |
| 6,519,729 B1* | 2/2003 | Whetsel | 714/727 |
| 6,534,853 B2 | 3/2003 | Liu et al. | |
| 6,590,294 B1 | 7/2003 | Lee et al. | |
| 6,622,273 B1* | 9/2003 | Barnes | 714/733 |
| 6,625,784 B1 | 9/2003 | Ohta et al. | |
| 6,686,615 B1 | 2/2004 | Cheng et al. | |
| 6,750,646 B1 | 6/2004 | Voss et al. | |
| 6,763,488 B2* | 7/2004 | Whetsel | 714/729 |
| 6,769,080 B2* | 7/2004 | Whetsel | 714/729 |
| 6,788,105 B2 | 9/2004 | Kono | |
| 6,873,927 B2 | 3/2005 | Chi et al. | |
| 6,876,215 B1 | 4/2005 | Hannan et al. | |
| 6,878,172 B2 | 4/2005 | Jensen | |
| 6,884,642 B2 | 4/2005 | Farnworth et al. | |
| 6,914,424 B2 | 7/2005 | Chi et al. | |
| 6,915,468 B2 | 7/2005 | Chambers et al. | |
| 6,933,524 B2 | 8/2005 | Hembree et al. | |
| 6,990,642 B2 | 1/2006 | Arakawa | |
| 7,020,699 B2 | 3/2006 | Zhang et al. | |
| 7,051,257 B2* | 5/2006 | Whetsel | 714/729 |
| 7,216,050 B1 | 5/2007 | Bachman et al. | |
| 7,279,887 B1 | 10/2007 | King et al. | |
| 7,428,715 B2 | 9/2008 | Fournier et al. | |
| 7,444,569 B2 | 10/2008 | Shidei | |
| 7,523,369 B2 | 4/2009 | Chang | |
| 7,568,142 B2* | 7/2009 | Whetsel | 714/727 |
| 7,636,871 B1 | 12/2009 | Blue et al. | |
| 7,761,751 B1 | 7/2010 | West | |
| 7,765,443 B1 | 7/2010 | Syed et al. | |
| 7,842,948 B2 | 11/2010 | Schieck et al. | |
| 7,919,981 B2 | 4/2011 | Irie | |
| 2001/0006233 A1 | 7/2001 | Vallett | |
| 2001/0010356 A1 | 8/2001 | Talbot et al. | |
| 2002/0016952 A1 | 2/2002 | Chang et al. | |
| 2003/0018945 A1 | 1/2003 | Foster et al. | |
| 2003/0023912 A1 | 1/2003 | Lesea | |
| 2003/0101395 A1 | 5/2003 | Man et al. | |
| 2003/0119297 A1 | 6/2003 | Lam et al. | |
| 2003/0120829 A1 | 6/2003 | Avvari et al. | |
| 2003/0124816 A1 | 7/2003 | Potts | |
| 2003/0131717 A1 | 7/2003 | Shiiya | |
| 2004/0015762 A1 | 1/2004 | Klotz et al. | |
| 2005/0055617 A1* | 3/2005 | Wang et al. | 714/727 |
| 2005/0166110 A1 | 7/2005 | Swanson et al. | |
| 2005/0229058 A1 | 10/2005 | Shidei | |
| 2007/0016834 A1 | 1/2007 | Debnath et al. | |
| 2008/0021669 A1 | 1/2008 | Blancha et al. | |
| 2008/0092002 A1 | 4/2008 | Shimooka | |
| 2008/0115005 A1* | 5/2008 | Kamada | 713/501 |
| 2008/0122463 A1 | 5/2008 | Dabral et al. | |
| 2008/0222205 A1 | 9/2008 | Lange | |

OTHER PUBLICATIONS

Nicolici, N.; Al-Hashimi, B.M.; , "Multiple scan chains for power minimization during test application in sequential circuits," Computers, IEEE Transactions on , vol. 51, No. 6, pp. 721-734, Jun. 2002 doi: 10.1109/TC.2002.1009155.*

Ho Fai Ko; Nicolici, N.; , "A Novel Automated Scan Chain Division Method for Shift and Capture Power Reduction in Broadside At-Speed Test," Quality Electronic Design, 2008. ISQED 2008. 9th International Symposium on , vol., no., pp. 649-654, Mar. 17-19, 2008 doi: 10.1109/ISQED.2008.4479814.*

"S. Chakravarthy and V. P. Dabholkar", "Two Techniques for Minimizing Power Dissipation in Scan Circuits During Test Application", Proceedings of the third Asian Test Symposium, Date: Nov. 1994, pp. 324-329.

"R. M. Chou, K. K. Saluja and V. D. Agrawal", "Scheduling Test for VLSI Systems Under Power Constraints", IEE Transactions on Very Large Scale Integration Systems, Date: Jun. 1997, pp. 175-185, vol. 5, No. 2.

"S. Gerstendorfer and H.J. Wunderlich", "Minimized Power Consumption for Scan-Based Bist", International Test Conference, Date: Sep. 1999, pp. 77-84.

"Ranganathan Sankaralingam, B.Pouya, and Nur A. Touba", "Reducing Test Power During Test Using Programmable Scan Chain Disable" 19th IEEE Proceedings of the VLSI Test Symposium, Date: Apr. 2001, pp. 319-324.

"V.P.Dabholkar, S.Chakravarthy, I.Pomeranz and S.Reddy", "Techniques for Minimizing Power Dissipation in Scan and Combinational Circuits During Test Application", IEEE Transaction on Computer-Aided Design of Integrated Circuits and Systems, Date: Dec. 1998, pp. 1325-1333, vol. 17, Issue 12.

"S.Wang and S.K.Gupta", "LT-RTPG: A New Test-Per-Scan BIST TPG for Low Heat Dissipation", International Test Conference, Date: Sep. 1999, pp. 85-94.

"Harald Varnken, Tom Waayers, Herve Fleury and David Lelouvier", "Enhanced Reduced Pin-Count Testing for Full-Scan Design", Proceedings of the 2001 International Test Conference, Date: 2001, pp. 738-747.

"D. Heidel et al.,", "High Speed Serializing/DE-Serializing Design for Test Method for Evaluating a 1Ghz Microprocessor", Proceedings VLSI Test Symposium, Date: IEEE 1998, pp. 234-238.

"Y.Zorian", "Testing the Monster Chip", IEEE Spectrum, Date: Jul. 1999, pp. 1119-1122.

"Saxena .J, Butler Kenneth .M and Whetsel Lee", "An Analysis of Power Reduction Techiniques in Scan Testing", Proceedings of International Test Conference, 2001, Date: Oct. 2001, pp. 670-677.

Chatterjee, Prosenjit, Article entitled: "Streamline Verification Process With Formal Property Verification to Meet Highly Compressed Design Cycle", pp. 674-677, Jun. 13-17, 2005.

* cited by examiner

SCALABLE SCAN-BASED TEST ARCHITECTURE WITH REDUCED TEST TIME AND TEST POWER

BACKGROUND

1. Field of Disclosure

The present disclosure relates generally to Integrated Circuit testing, and more specifically to a scalable scan-based architecture with reduced test time and power consumed during testing.

2. Related Art

Integrated circuits (IC) generally need to be tested after fabrication. One technique for testing ICs is scan-based testing. Scan-based testing generally refers to a technique in which registers (or more generally storage elements) in the IC are connected serially to form a shift register, often termed a scan chain. A test pattern (test vector) from an external test equipment is then shifted serially into the scan chain.

Once the test vector is loaded in the scan chain, a functional test is performed, with each bit in the test vector being provided as in input to a corresponding combinational logic. The output bit of each combinational logic is captured back in a scan chain, and the captured data is then shifted out to the test equipment. The test equipment then compares the captured data with a desired response.

It is generally desirable to reduce test time, and power consumed. Test time during a scan-based test generally refers to the total length of time needed to load (serially shift in) a test vector into a scan chain, perform a functional test and provide (serially shift out) the results of the test. Test time is inversely proportional to the speed (frequency) at which the test vector and response are shifted through the scan chain.

On the other hand, power consumed in the IC during testing is generally directly proportional to frequency at which the test vector and response are shifted through the scan chain. In general, it is desirable that a scan-based test architecture reduce both the test time as well as the power consumed in an IC during a scan-based test.

It may be desirable that the approach also be scalable. Scalability of a scan-based test architecture generally refers to the ability of the architecture/approach to accommodate a larger number of flip-flops. The approach often needs to be designed while keeping the test time and power consumption within acceptable levels.

Several aspects of the present invention provide a scalable scan-based test architecture with at least one of reduced test time and power.

BRIEF DESCRIPTION OF THE DRAWINGS

Example embodiments will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides a scalable scan-based architecture with reduced test time, and power consumed during testing. In an embodiment, the test vector is scanned serially into a functional memory element at a first frequency, which then de-multiplexes the bits in the test vector to multiple sub-chains at a lower frequency.

Due to the use of lower frequency in load and unload of test vector into the scan chains, the power dissipation is reduced. Due to the use of the higher frequency to shift-in and shift-out the test vector into the IC the test time is reduced. Due to the use of the functional memory elements for scanning in the test vector at higher frequency, any number of chains can potentially be supported.

Several aspects of the invention are described below with reference to examples for illustration. It should be understood that numerous specific details, relationships, and methods are set forth to provide a full understanding of the invention. One skilled in the relevant arts, however, will readily recognize that the invention can be practiced without one or more of the specific details, or with other methods, etc. In other instances, well-known structures or operations are not shown in detail to avoid obscuring the features of the invention.

2. Integrated Circuit

Figure 1:
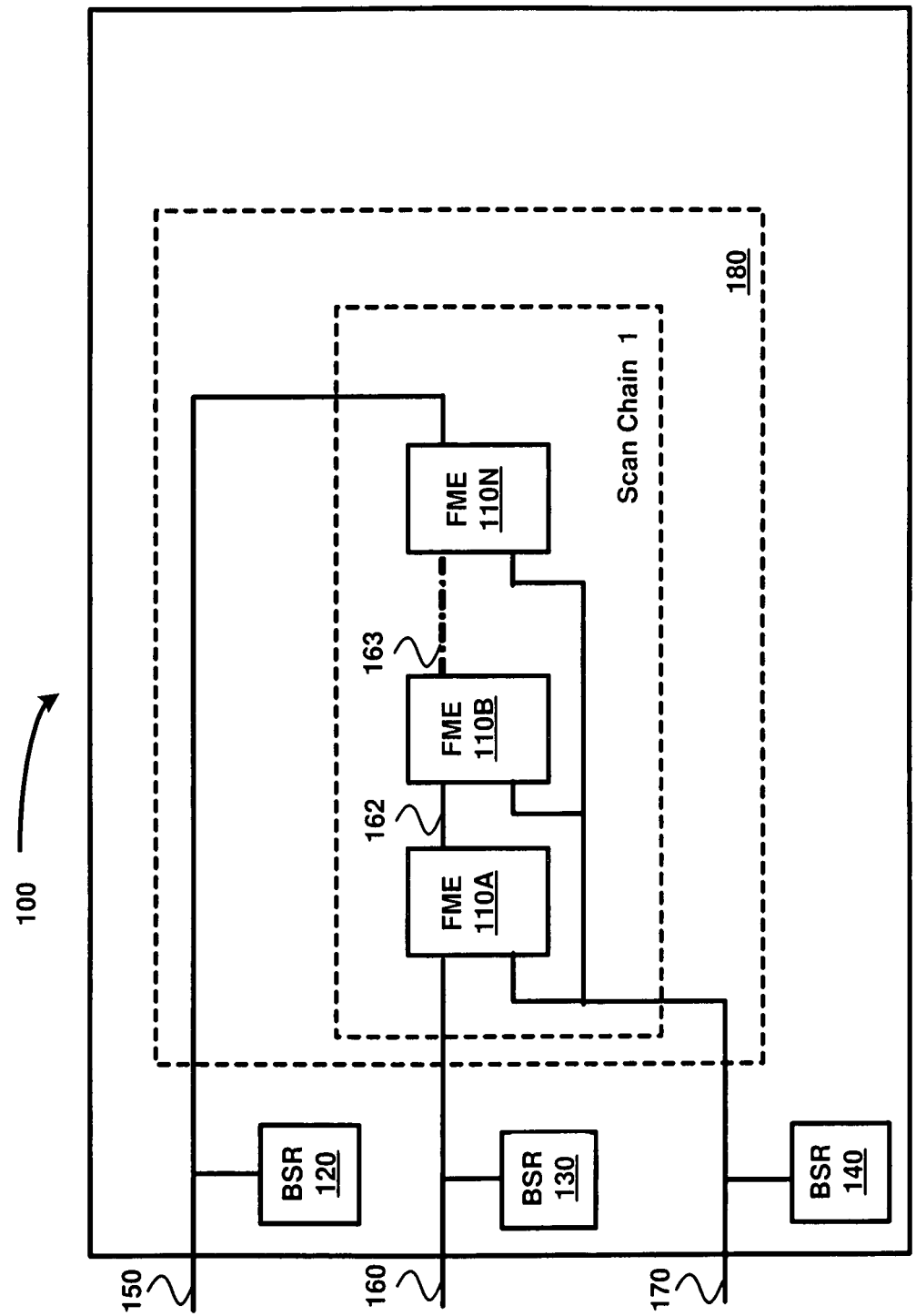
FIG. 1 is a block diagram of an example integrated circuit (IC) in which several aspects of the present invention can be implemented.

FIG. 1 is a block diagram of an example integrated circuit (IC) in which several aspects of the present invention can be implemented. IC 100 is shown containing functional memory elements (FME) 110A through FME 110N, boundary scan registers BSR 120, BSR 130 and BSR 140, and IC pins 150, 160 and 170. The components shown in FIG. 1 are merely for illustrative purposes, and a typical IC contains many more components, both in number and types. Each block is described below in further detail.

Components (including FME 110A through 110N) that implement the desired operational features of IC 100 are indicated in the Figure as being contained in functional portion 180. Operational features refer to the features provided during normal operation of the integrated circuit and the components operative when providing the operational features (even though used for testing also according to scan techniques, as described below) of the IC are deemed to be contained in the functional portion. In contrast, as described below, components such as boundary scan registers are not used to provide operational features (and used exclusively for testing), and are therefore deemed not to be functional components.

BSRs 120, 130 and 140 represent boundary scan cells used to implement boundary scan testing, for example, according to IEEE 1149.1 standard. Each of BSR 120, 130 and 140 maybe a flip flop (memory element) and is associated with a corresponding IC pin used for input/output. BSR 120 is associated with pin 150, BSR 130 is associated with pin 160, and BSR 140 is associated with pin 170, and the bit value in each BSR may be provided to the corresponding pin. It may be appreciated that each BSR is associated with a single corresponding I/O pin and thus the number of BSRs is generally limited.

As is well known in the relevant arts, the IEEE 1149.1 standard is used to test circuit components on a printed circuit board (PCB). Boundary scan cells such as BSR 120, BSR 130 and BSR 140 are configured to form a boundary scan register during a boundary scan test mode. The boundary scan register is controlled by a state machine (not shown) that can be accessed through a four or five pin Test Access Port (TAP, not shown) at the chip's boundary.

The state machine loads various instructions that enable the generation of desired signals on the IC pins via the boundary scan cells. As an example, assuming IC 100 is a processor chip (with portion 180 being the central processing unit—CPU), and is connected to an external memory (not shown), memory read/memory write cycles may be generated by loading the corresponding signal (bit) values in the boundary scan cells, and providing the values on the pins that connect to the memory.

Boundary scan cells (as well as the TAP) are operational only during such testing operations, and are in a power-down mode during normal operation of IC 100. For example, when CPU 180 is operational (to perform corresponding CPU related operations), boundary scan cells are disabled.

Functional memory elements (FME) 110A-110N represent memory storage elements (e.g., flip-flops) used in implementing operational features of IC 100, in addition to facilitating the testing of the IC. Due to such use, the FMEs are powered-on (contrary to the operation of the boundary scan cells) during normal operation. With respect to the example noted above, assuming that portion 180 is a central processing unit (CPU), FMEs 110A-110N maybe used as part of corresponding circuitry that implements the CPU.

As is well known in the relevant arts, components of CPU 180 (typically combinational logic) may be tested after fabrication using scan-based test approaches. As noted above, in such scan-based test FME 110A through 110N are configured as a scan chain (scan chain 1, in FIG. 1), with the output of one memory element being connected to the input of a next memory element. Thus, as shown in FIG. 1, during a scan test, output 162 of FME 110A is connected to the input of FME 110B, output 163 of FME 110B is connected to the input of FME 110C (not shown), and so forth.

Each of FME 110A through 110N may be clocked by a clock signal 170 (provided externally on pin/path 170). Test vectors are shifted in to scan chain 1 from an external test equipment (not shown) via pin/path 160. The output of scan chain 1 is provided from the last flip flop 110N in the scan chain to the external test equipment via pin/path 150.

Although not shown in FIG. 1, IC 100 may contain several such scan chains. Details of the operation of a portion of scan chain 1 during a scan test are described next.

3. Scan Test

Figure 2:
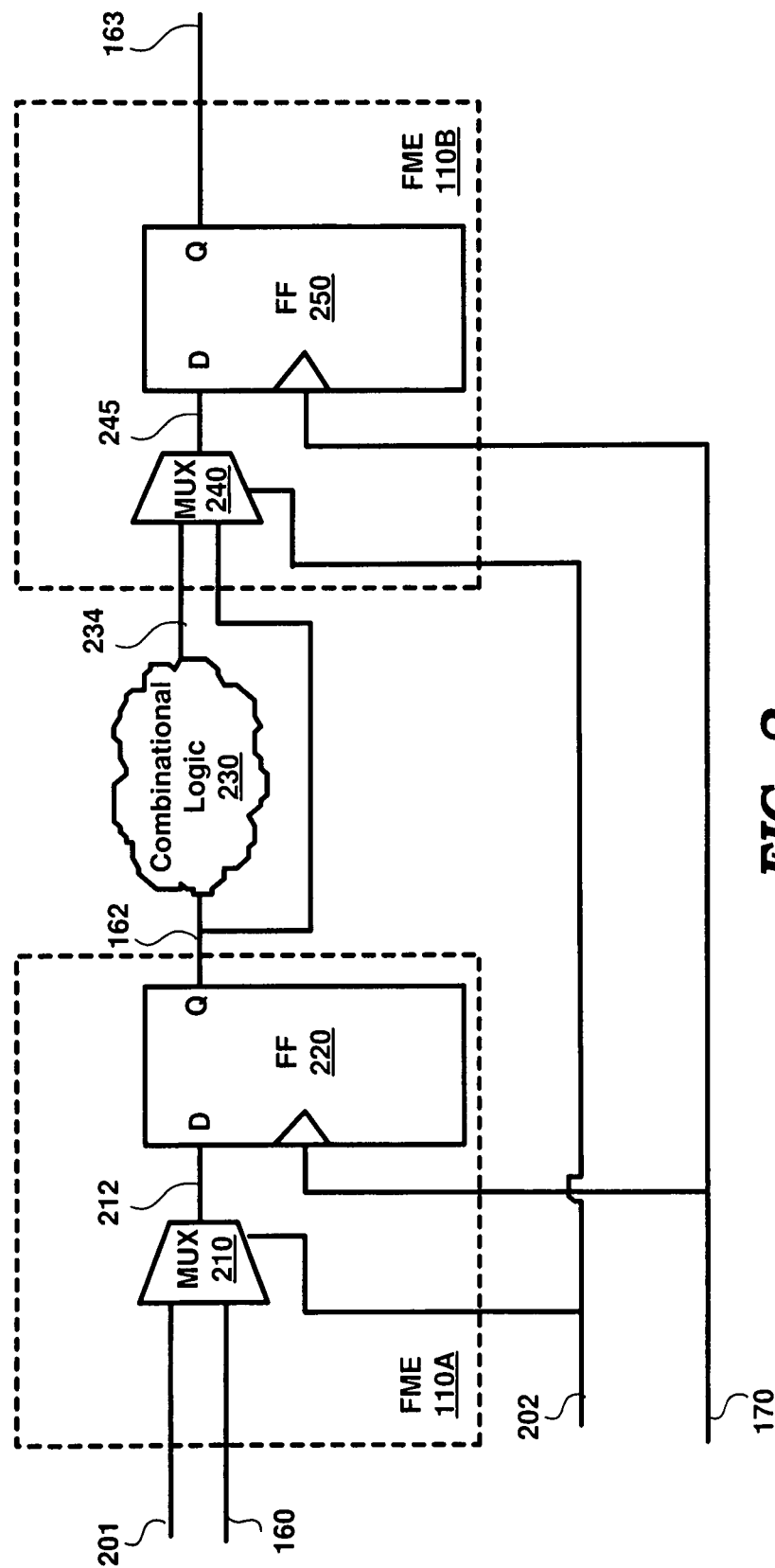
FIG. 2 is a block diagram illustrating the operation of a portion of a scan chain during scan test.

FIG. 2 is a block diagram illustrating the operation of a portion of a scan chain during a scan test. FIG. 2 is shown containing FME 110A, FME 110B (of FIG. 1), and combinational logic 230. Though not shown in FIG. 1, combinational logic 230 is also part of CPU 180 of FIG. 1.

FME 110A is shown containing multiplexer (MUX) 210 and flip-flop (FF) 220. MUX 210 receives the corresponding bits of a test vector (in serial form) on path 160, and a functional input on path 201. The functional input on path 201 may be received from another flip flop (not shown) in circuit portion 180. MUX 210 provides one of inputs 160 and 201 on path 212 to FF 220 depending on the value of a select bit on path 202. The select bit on path 202 may be controlled from an external test equipment such that the bit is set to one value during testing and another value during normal operation. FF 220 transfers the bit received on path 212 as an output bit on path 162 in response to clock signal 170.

Combinational logic 230 receives an input on path 162, and provides an output on path 234. Output 234 contains the result of the combinational logic operation performed on input 162 by combination logic 230. Paths such as path 162-combinational logic 230-path 234 are often termed functional paths. Merely for conciseness, only a single combinational logic 230 being tested based on inputs from a single memory cell. However, in real-world implementations, an integrated circuit typically contains many such logics, which are tested based on multiple inputs received from respective FMEs.

FME 110B is shown containing multiplexer (MUX) 240 and flip-flop (FF) 250. MUX 240 provides one of inputs 162 and 234 on path 245 to FF 250 depending on the value of the select bit on path 202. FF 250 provides an output bit on path 163, which may be connected to a next (FME 110C, not shown) memory element in the scan chain. FF 220 and 250 receive a clock signal on path 170.

During a scan test, select bit 202 (scan enable) is activated to cause MUX 210 to provide input 160 on path 162, and MUX 240 to provide input 162 on path 245. A test vector is then shifted into scan chain 1 by clock 170. Consequently, corresponding test bits are stored in FF 220 and FF 250.

Once the test vector is shifted into scan chain 1, scan enable 202 is deactivated. As a result, each memory element (and corresponding flip flop) receives the output of the corresponding combination logic. For example, MUX 240 provides output 234 of combinational logic 230 on path 245 to FF 250. A capture pulse is applied on clock 170. As a result, the output of combinational logic 230 is captured by FF 250. It may be appreciated that scan enable 202 is deactivated even during the normal operation of the integrated circuit.

Other flip flops (not shown) similarly capture the response of corresponding combinational logic blocks. The operation of providing test bits of the test vector to the combination logic blocks, and capturing the corresponding outputs of the combinational logic blocks is generally termed as performing a functional test.

Scan enable 202 is then activated again, and the response (outputs) of the combinational logic blocks to the test vector is shifted out via path 150 (FIG. 1).

Since the number of memory elements in a scan chain (e.g., scan chain 1) is typically large, shifting in the test vector and shifting out the response (test time) may consume a large amount of time. Test time may be reduced by increasing the frequency of clock 170 used for shifting in and shifting out. However, such an approach may cause proportionately more power to be dissipated in the memory elements (in a given time duration), and potentially violate the maximum power rating of the integrated circuit.

Various aspects of the present invention provide a scalable scan-based architecture that enables minimizing both test time as well as power consumption during a scan test, as described next with respect to a flowchart.

4. Approach

Figure 3:
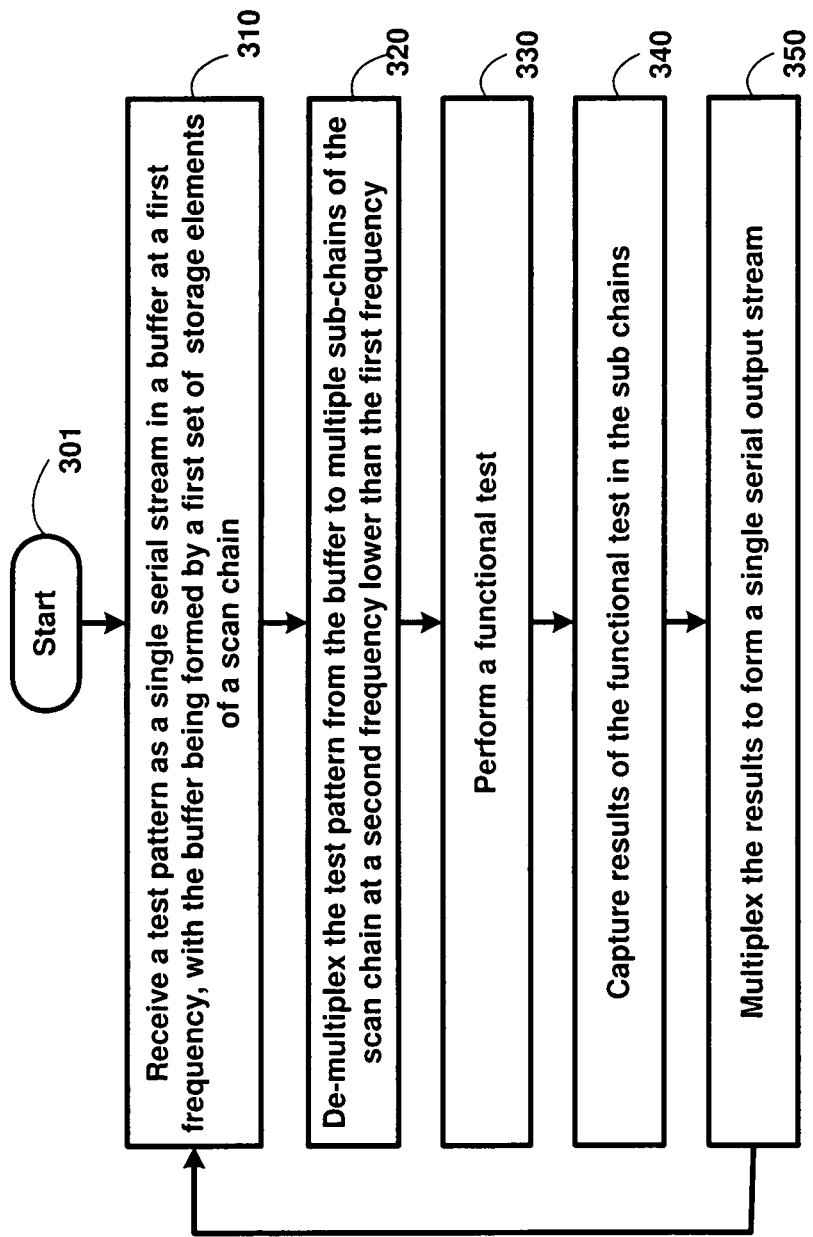
FIG. 3 is a flowchart illustrating the manner in which a scan-based test can be performed in an embodiment of the present invention.

FIG. 3 is a flowchart illustrating the manner in which a scan-based test can be performed in an embodiment of the present invention. The flowchart is described with respect to FIG. 1, and in relation to IC 100, merely for illustration. However, various features can be implemented in other environments and with other components. Furthermore, the steps are described in a specific sequence merely for illustration.

Alternative embodiments in other environments, using other components and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, IC 100 receives a test pattern in a single serial stream in a buffer at a first frequency, with the buffer being formed by a first set of functional memory elements of a scan chain. The first frequency may be selected to be sufficiently high such that test time is minimized. Control then passes to step 320.

In step 320, the test pattern received in the buffer is demultiplexed to multiple sub-chains of the scan chain at a second frequency lower than the first frequency. The sub-chains contain other functional memory elements (not included in the first set) of the scan chain. The second frequency is generally chosen such that power consumption in the components of the scan chain is below a desired level. Control then passes to step 330.

In step 330, a functional test is performed. As noted above, during a functional test, the respective test bits in the test pattern are provided to corresponding combinational logic blocks. Control then passes to step 340.

In step 340, results of the functional test are captured back in the sub-chains. Control then passes to step 350.

In step 350, the result bits are multiplexed to form a single serial output stream. Control then passes to step 310, and steps 310 through 350 may be repeated to perform another functional test.

The features described above can be implemented using various approaches. The manner in which the approach described above may be implemented is described next with examples.

5. Architecture

Figure 4:
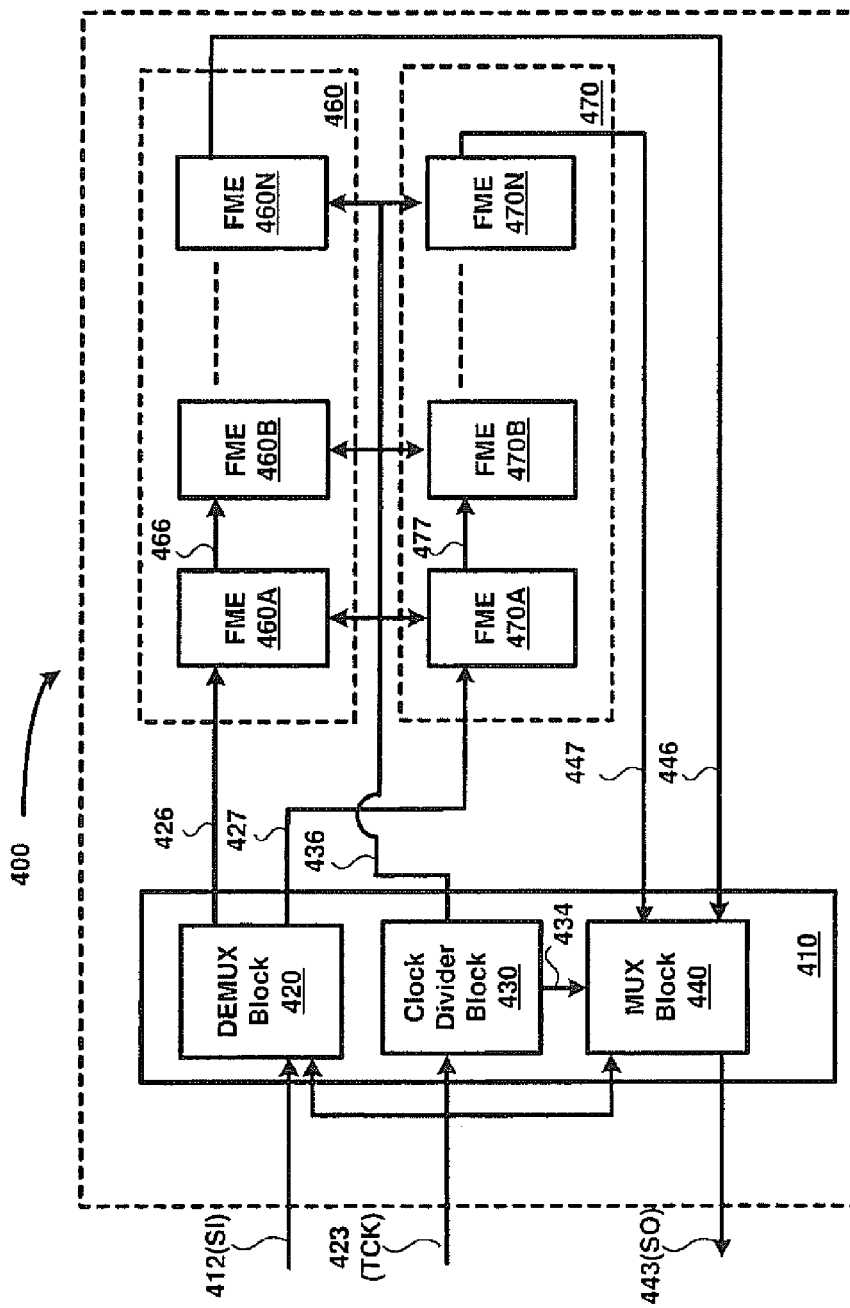
FIG. 4 is a block diagram of an IC implementing a scan-based test architecture in an embodiment of the present invention.

FIG. 4 is a block diagram of an IC implementing a scan-based test architecture in an embodiment of the present invention. IC 400 is shown containing scan splitter block 410, functional memory elements 460A-460N, and functional memory elements 470A-470N. Each block is described in detail below.

Functional memory elements 460A-460N and 470A-47ON are shown connected to from two sub-chains 460 and 470 respectively. Within each sub-chain, the corresponding functional memory elements are connected serially, with the output of functional memory element being provided as input to a next functional memory element.

Thus, output of FME 460A is provided as input to FME 460B (in sub-chain 460), output of FME 470A is provided as input to FME 470B (in sub-chain 470), etc, in a manner similar to that described above with respect to FIG. 1. Although not shown, the outputs of each FME 460A-460N and 470A-470N is also connected to a corresponding combinational logic block to be tested (similar to combination logic 230 shown in FIG. 2).

Scan splitter block 410 receives a test vector on path 412 and de-multiplexes the test vector into sub-vectors provided on paths 426 and 427 respectively. Each of the vectors contains a corresponding sequence of bits. In the described embodiments, alternative bits are provided on the paths 426 and 427, however, other approaches can be chosen as suited in the specific environments. According to an aspect of the present invention, scan splitter block 410 is implemented using one or more functional memory elements, which are also used during normal operation of the IC 400.

In the example of FIG. 4, scan splitter block 410 is shown containing de-multiplexer (DEMUX) block 420, clock divider block 430 and multiplexer (MUX) block 440. DEMUX block 420 receives a test vector (SI) in serial form on path 412, stores (buffers) the serial test vector, and demultiplexes the test vector on path 426 to sub-chain 460, and path 427 to sub-chain 470. DEMUX block 420 also receives test clock (TCK). Scan splitter block 410 receives the bits on path 412 at twice the speed compared to the bits transmitted in each of paths 426 and 427 in the present example.

Clock divider block 430 receives a test clock (TCK) on path 423, and provides on path 436 a lower speed clock (for example, obtained by dividing TCK 423) to the functional memory elements in sub-chains 460 and 470. Clock divider block 430 also generates a 'select' clock 434 provided to MUX block 440. An external test equipment may provide SI and TCK. Clock divider block 430 may be implemented in a known way.

MUX block 440 receives serial streams containing the response (result) of a functional test from sub-chains 460 and 470 on paths 446 and 447 respectively, multiplexes the multiple streams to form a single output stream (SO) provided on path 443. An external test equipment may receive the output stream. MUX block 440 also receives test clock (TCK) and provides each of the bits according to TCK. Paths 412, 423 and 443 may be connected to pins of IC 400.

Although only two sub-chains are shown in FIG. 4, it must be understood that any number of sub-chains similar to 460 and 470 may be created, and scan splitter block 410 may demultiplex a received test vector across all of such sub-chains, and multiplex result streams from all such sub-chains to form a single output stream.

The internal details of scan splitter block 410 in an embodiment of the present invention are described below.

6. De-Multiplexer Block

Figure 5:
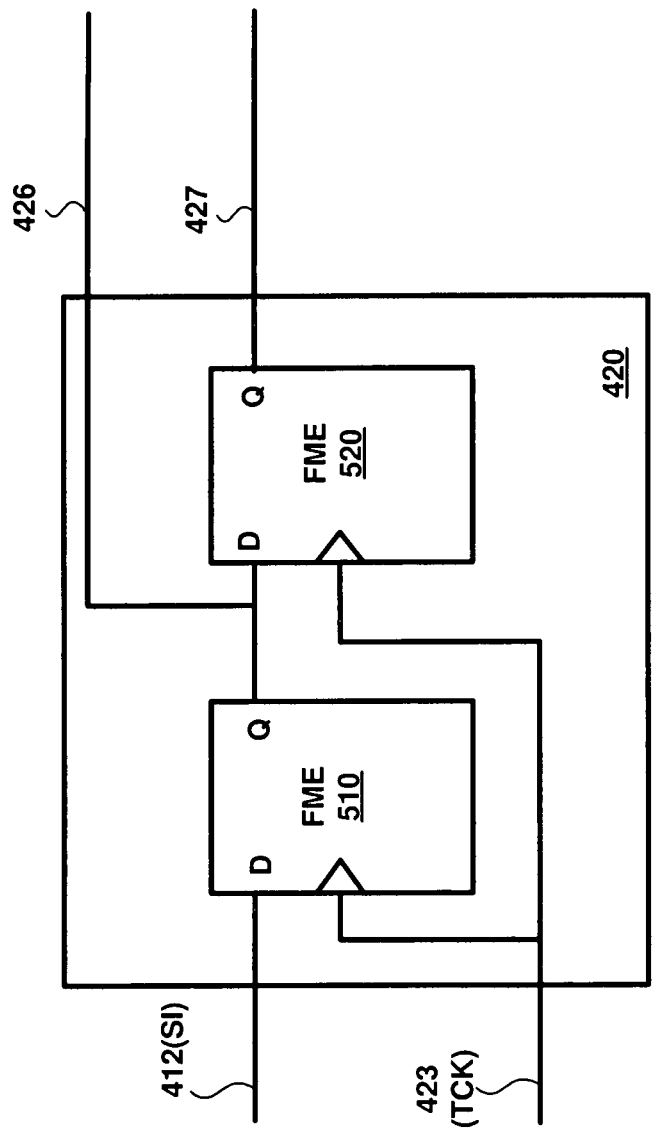
FIG. 5 is a block diagram of a de-multiplexer block in an embodiment of the present invention.

FIG. 5 is a block diagram of a de-multiplexer block in an embodiment of the present invention. DEMUX block 420 is shown containing FME 510 and FME 520. Both FME 510 and 520 receive a test clock on path 423.

FME 510 receives on path 412 (SI) bits of a test vector in serial form, and stores each bit at a time instance specified by an edge of clock 423. FME 510 provides the stored bit as input to FME 520, as well as on path 426 to sub-chain 460 (FIG. 4). FME 520 stores the input on received from FME 510 at an edge of clock 423, and provides the stored bit on path 427 to sub-chain 470 (FIG. 4).

It may be appreciated that DEMUX block 420 operates as a buffer, receiving (storing) bits of a test vector at a higher frequency (frequency of clock 423), and de-multiplexing the received bits on paths 426 and 427 in the form of corresponding sub-vectors.

As noted above, the bits multiplexed by DEMUX block 420 are shifted through sub-chains 460 and 470 at a lower frequency by divided clock 436 (FIG. 4). In an embodiment the clock signal on path 436 has a frequency half that of the clock signal on path 423.

Figure 6:
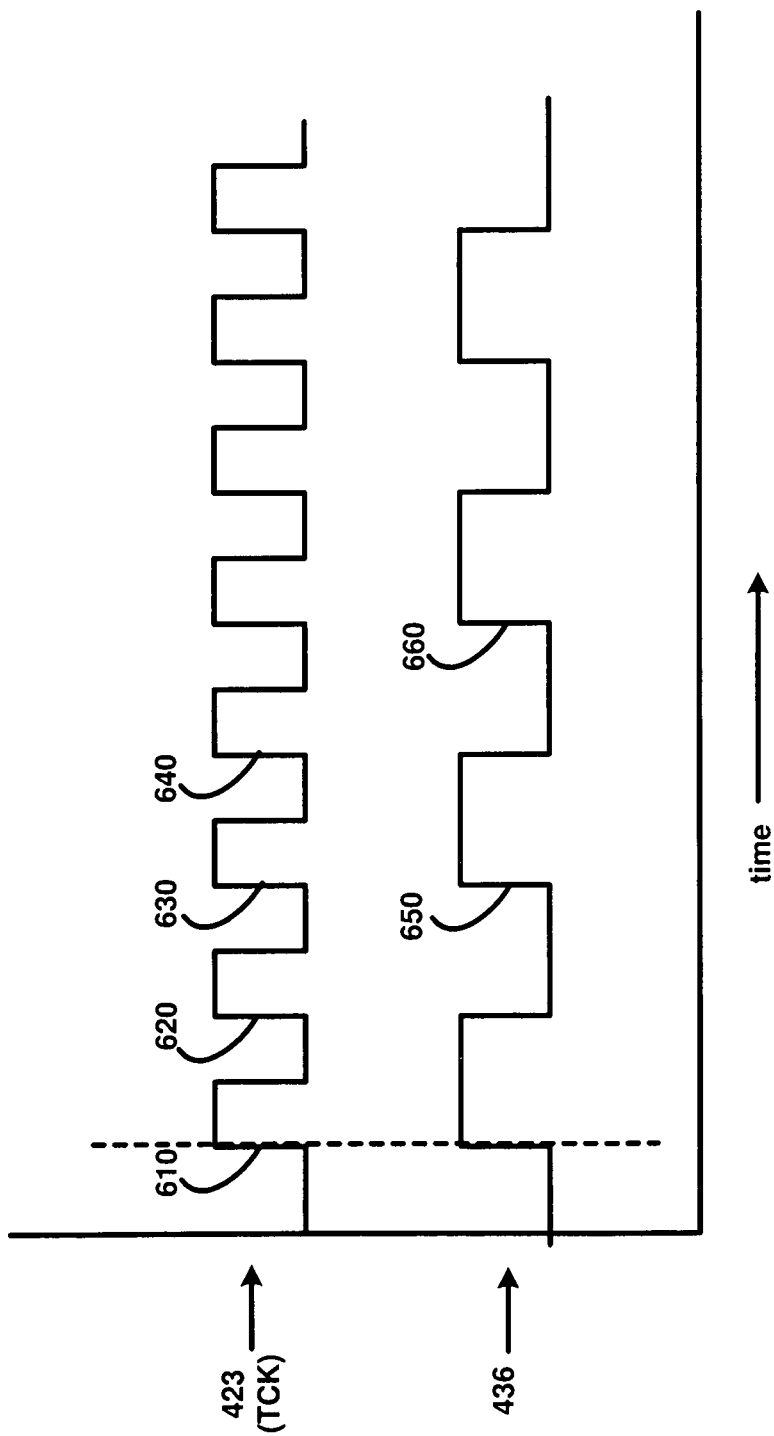
FIG. 6 is an example timing diagram illustrating the de-multiplexing of a test vector into sub-chains in an embodiment of the present invention.

FIG. 6 is an example timing diagram illustrating the relative time instances (with respect to clocks 423 and 436) at which bits received on path 412 are stored (in the process of shifting-in) in FMEs 510, 520, and FMEs 460A and 470A (FIG. 4). For simplicity only a few illustrative cycles (corresponding to storage of four bits of the test vector) are illustrated in the Figure.

With respect to FIG. 6, the bit stored in FME 510 at clock edge 610 of clock 423 is stored in FME 460A at the clock edge 650 of clock 436. The bit stored in FME 520 at clock edge 620 of clock 423 is stored in FME 470A also at the clock edge 650 of clock 436. Similarly, the bits stored in FME 510 at clock edge 630 of clock 423 and FME 520 at clock edge 640 of clock 423 are respectively stored in FME 460A and FME 470A at clock edge 660 of clock 436. It may be noted that clock edges 630 and 650 occur substantially simultaneously.

As an example, if the bit sequence 0110 (being a portion of the test vector received on path 412) is assumed to be shifted in via path 412, with the bits 0, 1, 1 and 0 corresponding to clock edges 610, 620, 630 and 640 respectively, at edge clock edge 650 FME 510 and 520 respectively store a 0 and 1, while at edge clock edge 660 FME 510 and 520 respectively store a 1 and 0.

It may be appreciated that bits of the test vector are shifted through sub-chains 460 and 470 at half the rate at which the bits are received in DEMUX block 420. Since there are two sub-chains as many bits are shifted in through the sub-chains as are received on pin 412. However, each functional memory element in a sub-chain is toggled only at half the frequency.

It may be appreciated that the technique described above enables test time to be decreased while reducing test power. As an example, assume that it is desired to increase the scan frequency (frequency of clock 423 of FIG. 4) from 10 MHz to 16 MHz to reduce test time. Since the shift frequency in sub-chains 460 and 470 is less than the frequency of clock 423 (e.g., half that of clock 423), the frequency in sub-chains 460 and 470 is only 8 MHz as against 16 MHz otherwise. Thus, test time and test power are reduced.

Continuing with the example, assuming that the scan frequency is to be increased further to 32 MHz (to further reduce test time), with internal shift frequency being maintained at 8 MHz, four sub-chains may be used, with one test bit being provided to each of the four sub-chains in one clock cycle duration of the internal 8 Mhz clock, i.e., in 125 nano seconds. The reduction in test time is approximately 37%. At the same time, due to the reduction in internal shift frequency from 10 MHz to 8 MHz (a reduction of 20%), dynamic test power will reduce by approximately 20% since the dynamic test power is directly proportional to frequency.

Further, the features of the present invention may also enable the number of test pins (test pin count) to be reduced. To illustrate, assuming there are two (separate) scan chains to be tested, a prior approach may require four test pins (one scan-in pin and one scan-out pin for each of the scan chains). However, according to features of the present invention, the test bits corresponding to both the scan chains (referred to as scan chain 1 and scan chain 2 below) may be provided from an external tester on a single pin.

Scan splitter block 410 may be implemented to split the single serial stream into two sub-chains, with each sub-chain now corresponding to scan chain 1 and scan chain 2 respectively. The response of the sub-chains may be multiplexed onto a single pin. Thus, only 2 pins (a relative reduction of 50%) are required for supporting both the scan chains.

Alternatively, or in addition, each of the scan chains 1 and 2, may be further split into two sub-chains each, with a total of four sub-chains. DEMUX block 420 may be implemented as 1:4 de-multiplexer, MUX block 440 may be implemented as a 4:1 multiplexer, with clock divider block 430 generating a divide-by-4 clock to drive the corresponding sub-chains. Again, only two pins to connect to an external tester would be required for the test, while reduction in test time and test power is also obtained at the same time.

Thus, it may be appreciated that the techniques of the present invention enable reducing test time, test power as well as test pin-count simultaneously. The technique can be customized to reduce one or more of the three factors (test time, test power, test pin count) in scan based testing.

It is noted that even though the shift frequency within DEMUX block 420 and MUX block 440 is at the same rate as clock 423, the number of FMEs in these blocks may be few, and thus do not appreciably cause an increase in power dissipation.

In general, when the number of sub-chains into which a scan vector (on path 412) is de-multiplexed equals "N" (with scan splitter block 410 being termed an Nth order splitter), the reduction in test time is approximately 1/N of the "original" test time (i.e., test time required when test vector is not demultiplexed to multiple sub-chains). Similarly, the approximate reduction in test power is 1/N of the "original" test power, and the reduction in test pin-count is 1/N of the "original" test pin-count required to test the IC.

Further, since a potentially large number of functional memory elements may be available in a functional portion of IC 400, and since DEMUX and MUX blocks are implemented using functional memory elements, several blocks and corresponding sub-chains (similar to DEMUX block 420, MUX block 440 and sub-chains 460 and 470) may be operated simultaneously. Thus, the scan-based test architecture described above is scalable to support potentially any number of scan chains simultaneously.

It may also be appreciated that the technique described above requires fewer number of pins to be connected from an external tester. Assuming that the technique of multiplexing and de-multiplexing of the present invention were not used, the number of scan chains would generally depend on (and limited by) the number of pins available for scan-ins and scan-outs (similar to pins 412 and 443 respectively).

According to the approaches described above, since a single scan-in input (e.g., on pin 412) can be provided potentially to any number of parallel sub-chains, the total number of external pins for supporting multiple scan chains is reduced. Consequently, multiple scan chains (internal to an IC) can be tested using one pair of scan-in and scan-out pins (in general fewer scan-in and scan-out pins), with very little or no impact on test application time and/or test power consumption.

A multiplexer block used in an embodiment of the present invention is described next.

7. Multiplexer Block

Figure 7:
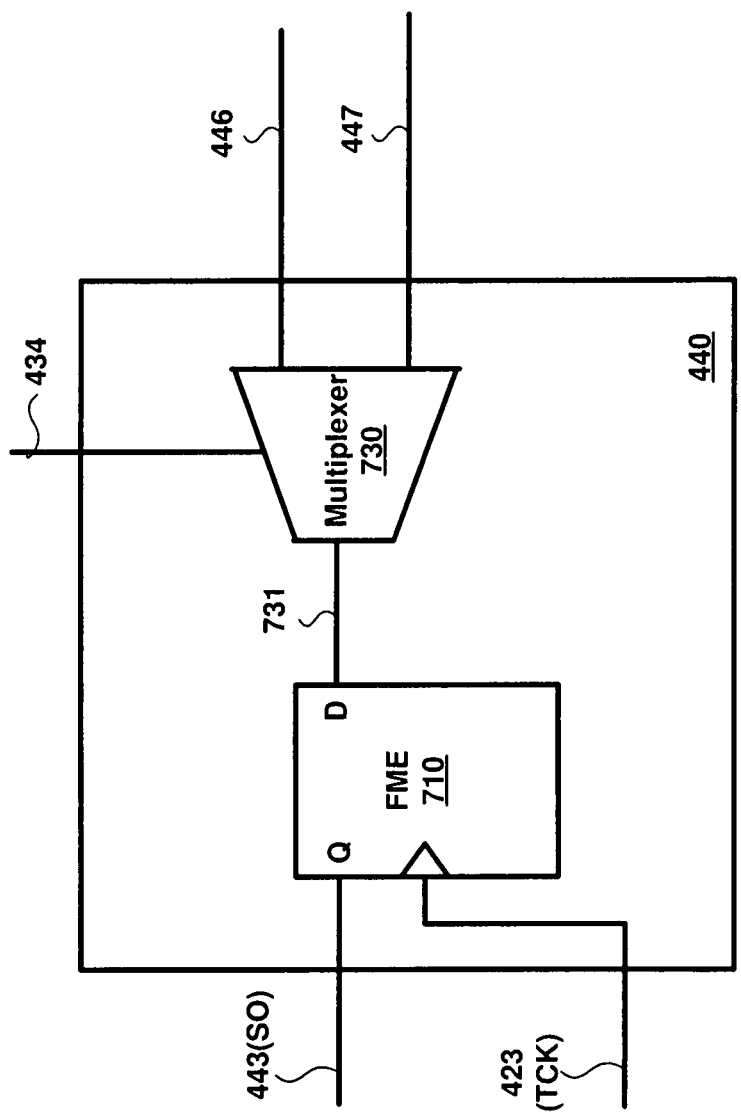
FIG. 7 is a block diagram of a multiplexer block in an embodiment of the present invention.

FIG. 7 is a block diagram of a multiplexer block in an embodiment of the present invention. MUX block 440 is shown containing FME 710 and multiplexer 730. FME 710 receives test clock (TCK) 423.

Multiplexer 730 receives response bits (results of a functional test on corresponding combinational logic blocks) from sub-chain 460 on path 446, as well as response bits from sub-chain 470 on path 447. Multiplexer 730 provides on path 731 either of the bits on path 446 or the bits on path 447 based on the value of the select signal on path 434.

FME 710 receives bits forwarded by multiplexer 730 on path 731, and provides (at time instances specified by an edge of clock 423) the bits as a single serial output stream on path 443 (SO) as the response to a functional test.

Figure 8:
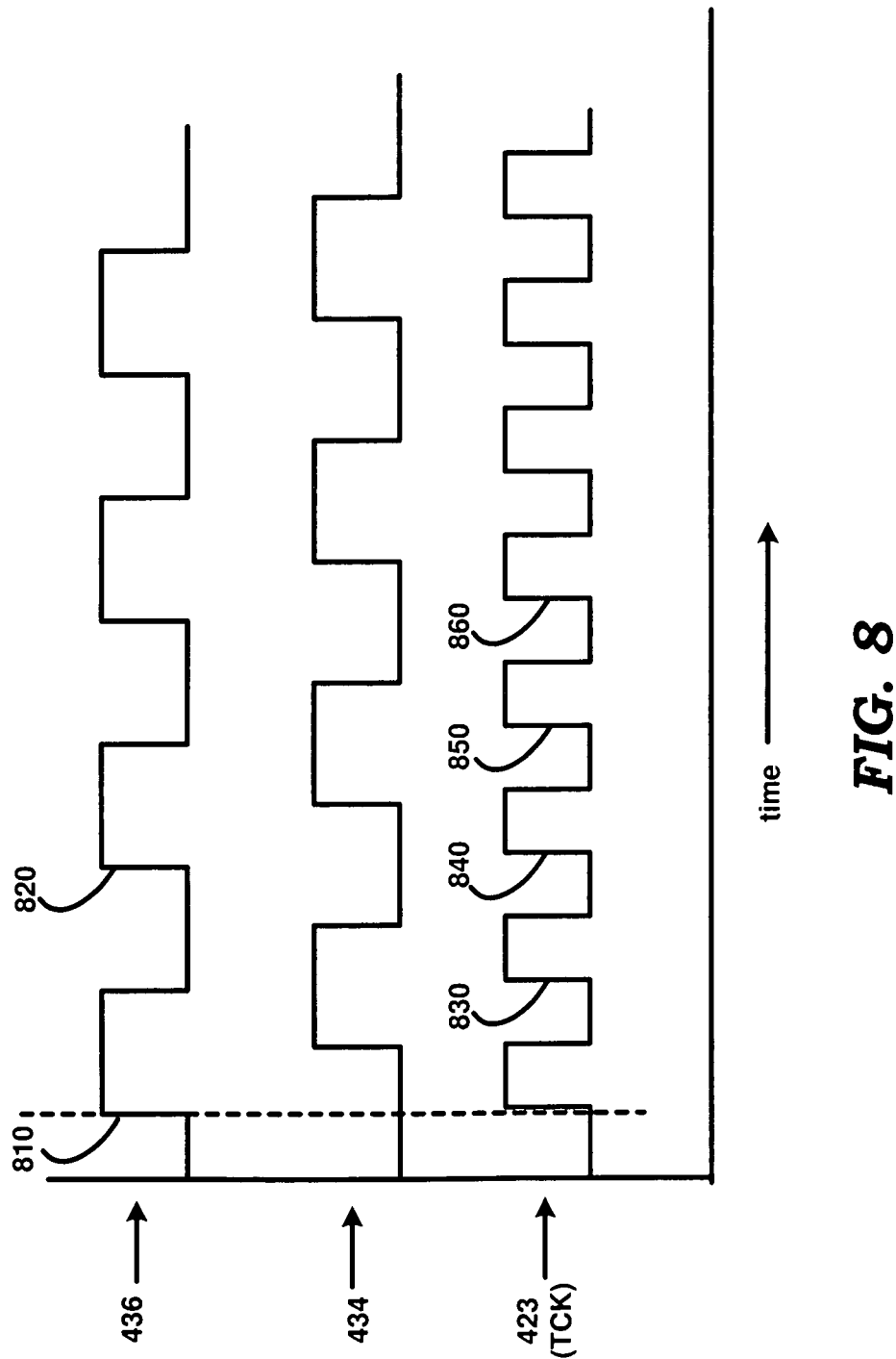
FIG. 8 is an example timing diagram illustrating the multiplexing of response vectors from sub-chains to form a single serial output stream in an embodiment of the present invention.

FIG. 8 is an example timing diagram illustrating the relative time instances (with respect to clocks 423, 436 and 434) at which response bits in the output stream are provided on path 443. For simplicity only a few illustrative cycles (corresponding to four bits of the output stream) are illustrated in the Figure. In the Figure it is assumed that multiplexer 730 forwards input 446 on path 731 when select signal 434 is at logic high, and forwards input 447 on path 731 when select signal 434 is at logic low With respect to FIG. 8, it is assumed that each of FME 460N and FME 470N (FIG. 4) provide an output bit (respectively on paths 446 and 447) at clock edge 810 of clock 423. At clock edge 830 of clock 423, select signal 434 is at logic high, and multiplexer 730 forwards the bit on path 446 on path 731. Therefore, FME 710 provides the bit on path 446 on output 443.

At clock edge 840, select signal 434 is at logic low, and multiplexer 730 forwards the bit on path 447 on path 731. Therefore, FME 710 provides the bit on path 447 on output 443. Similarly, the respective bits provided by FME 460N and FME 470N at clock edge 820 are shifted out on output 443 at clock edges 850 and 860 respectively. It may be noted that clock edges 820 and 840 may occur substantially simultaneously.

It should be appreciated that several details described above are merely examples. Several alternative embodiments will be apparent to one skilled in the relevant arts by reading the disclosure provided herein. For example, though DEMUX block 420 is described as containing two functional memory elements, alternative embodiments of DEMUX block 420 may be implemented using more or fewer than two functional memory elements, and/or different combination of components and interconnections.

For example, DEMUX block 420 may be implemented to contain only one functional memory element (for example only FME 510) to perform a multiplexing operation. In such an example embodiment, FME 510 receives test vectors at the frequency of clock 423, and elements of sub-chains 460 and 470 may be clocked by anti-phase clocks (phase difference of 180 degrees) at half (or some divided) frequency of clock 423. In such an embodiment, FME 460A and FME 470A store every alternate output of FME 510. MUX block 440 may be similarly modified to contain only one functional memory element.

Though not expressly shown, the functional memory elements of FIGS. 5 and 7 would each provide an input to combinational logic at least in some scenarios of normal operation of IC 400. The functional memory elements can also provide inputs to respective combinational logics in the functional test mode as well, depending on the specific portions of the integrated circuit being tested. Further, assuming that several scan splitter blocks (similar to scan splitter block 410) are present, the functional memory elements in such scan splitter blocks may be connected as a separate (single) scan chain, and scan test may be performed to test the corresponding combinational logic blocks.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A circuit comprising:
a first sub-chain containing a first sequence of functional memory elements;
a second sub-chain containing a second sequence of functional memory elements;
a scan splitter block comprises a first functional memory element, said scan splitter block operable to receive a test vector containing a sequence of bits at a first frequency and to de-multiplex said sequence of bits such that a first subset of bits is sent to said first sub-chain and a second subset of bits is sent to said second sub-chain at a second frequency and a third frequency respectively in a scan mode, said first subset of bits and said second subset of bits being contained in said sequence of bits, wherein said scan splitter block is operable to capture results from said first sub-chain and said second sub-chain and output said results at said first frequency; and
a combinational logic to receive at least one input from said first sub-chain and said second sub-chain and to generate an output bit in a functional test mode, wherein said first frequency is greater than each of said second frequency and said third frequency, wherein said first sequence of functional memory elements, said second sequence of functional memory elements, and said first functional memory element are contained in a functional portion of said circuit.

2. The circuit of claim 1, wherein said first functional memory element of said scan splitter block is operable to stored data corresponding to a number of sub-chains including said first sub-chain and said second sub-chain.

3. The circuit of claim 2, wherein said second frequency is equal to said third frequency and also to half of said first frequency.

4. The circuit of claim 3, wherein said scan splitter block comprises a clock divider which receives a clock signal with said first frequency and generates a divided clock signal at said second frequency, wherein said divided clock signal drives scanning into said first sub-chain and said second sub-chain and said clock signal is used to receive said sequence of bits.

5. The circuit of claim 4, wherein said scan splitter block comprises:
a second functional memory element, wherein an output of said first functional memory element is connected to an input of said second functional memory element and also as an input to said first sub-chain,
wherein an output of said second functional memory element is connected as an input to said second sub-chain,
both of said first functional memory element and said second functional memory element being clocked by said clock signal.

6. The circuit of claim 4, wherein said scan splitter block further comprises a second functional memory element used to multiplex a first set of response bits from said first sub-chain and a second set of response bits from said second sub-chain to form a single serial output stream as a result of scan testing,
wherein said first set of response bits and said second set of response bits are generated by said combinational logic during said functional test mode.

7. The circuit of claim 6, wherein said scan splitter block comprises:
a multiplexer having a control input, a first input, a second input and an output, said multiplexer selecting a bit on either said first input or said second input based on said control input and providing said selected bit on said output, wherein said control input is designed to select respective bits from said first input and said second input in alternative clock cycles,
wherein said first input is coupled to receive said first set of response bits and said second input is coupled to receive said second set of response bits,
a third functional memory element receiving said output of said multiplexer,
wherein said third functional memory element is clocked by said clock signal such that said single serial output stream is provided as an output of said third functional memory element.

8. The circuit of claim 1, wherein said first functional memory element of said scan splitter block comprises a single memory element.

9. The circuit of claim 1, further comprising a plurality of boundary scan registers.

10. An integrated circuit comprising:

means for receiving a test vector containing a sequence of bits at first frequency using at least one functional memory element;

means for de-multiplexing said test vector into a plurality of sub-chains in the form of a corresponding number of sub-vectors, each sub-chain containing a corresponding set of functional memory elements connected in series, wherein each sub-vector is scanned into said corresponding sub-chain at a frequency lower than said first frequency, and wherein each sub-vector is scanned into said corresponding sub-chain in alternative clock cycles;

means for performing a functional test on a combinational logic contained in said integrated circuit after said de-multiplexing;

means for capturing in said plurality of sub-chains said results generated by said combinational logic in said functional test;

means for examining said results to determine whether said integrated circuit operates according to a desired specification, wherein said sets of functional memory elements and said at least one functional memory element together form a functional portion of said integrated circuit;

means for multiplexing the results captured by said plurality of sub-chains to form a single serial output stream; and means for outputting said single serial output stream at said first frequency.

11. The integrated circuit of claim 10, wherein said examining examines said single serial output stream.

12. The integrated circuit of claim 11, wherein said plurality of sub-chains comprises a first sub-chain and a second sub-chain, wherein each of a frequency at which a first sub-vector is scanned into said first sub-chain and a frequency at which a second sub-vector is scanned into said second sub-chain is equal to half of said first frequency, wherein said first sub-vector and said second sub-vector are contained in said sub-vectors.

13. A method of testing an integrated circuit, said method comprising:

receiving a test vector containing a sequence of bits at first frequency using at least one functional memory element;

de-multiplexing said test vector into a plurality of sub-chains in the form of a corresponding number of sub-vectors, each sub-chain containing a corresponding set of functional memory elements connected in series, wherein each sub-vector is scanned into said corresponding sub-chain at a frequency lower than said first frequency, and wherein each sub-vector is scanned into said corresponding sub-chain in alternative clock cycles;

performing a functional test on a combinational logic contained in said integrated circuit after said de-multiplexing;

capturing in said plurality of sub-chains said results generated by said combinational logic in said functional test;

examining said results to determine whether said integrated circuit operates according to a desired specification, wherein said sets of functional memory elements and said at least one functional memory element together form a functional portion of said integrated circuit;

multiplexing said results captured by said plurality of sub-chains to form a single serial output stream; and sending said single output stream at said first frequency to a test equipment.

14. The method of claim 13, wherein said examining examines said single serial output stream.

15. The method of claim 14, wherein said test equipment performs said examining, wherein said response bits in each of said plurality of sub-chains are received at said frequency lower than said first frequency.

16. The method of claim 14, wherein said plurality of sub-chains comprises a first sub-chain and a second sub-chain, wherein each of a frequency at which a first sub-vector is scanned into said first sub-chain and a frequency at which a second sub-vector is scanned into said second sub-chain is equal to half of said first frequency, wherein said first sub-vector and said second sub-vector are contained in said sub-vectors.

17. The method of claim 13, wherein said first frequency is an integral multiple of said frequency at which said sub-vectors are scanned into said corresponding sub-chains.

18. The method of claim 13, wherein a first power consumption level of said first sub-scan at said second frequency is less than a second power consumption level of said first sub-chain at said first frequency.

* * * * *